(12) United States Patent
Hagen et al.

(10) Patent No.: US 7,045,881 B2
(45) Date of Patent: May 16, 2006

(54) ELECTRONIC COMPONENT WITH SHIELDING AND METHOD FOR ITS PRODUCTION

(75) Inventors: Robert-Christian Hagen, Barbing (DE); Gerald Ofner, Bad Abbach (DE)

(73) Assignee: Infineon Technologies AG, Munich (DE)

( * ) Notice: Subject to any disclaimer, the term of this patent is extended or adjusted under 35 U.S.C. 154(b) by 499 days.

(21) Appl. No.: 09/993,266

(22) Filed: Nov. 19, 2001

(65) Prior Publication Data

US 2002/0081819 A1 Jun. 27, 2002

(30) Foreign Application Priority Data

Nov. 17, 2000 (DE) ................................ 100 65 895

(51) Int. Cl.
 *H01L 23/552* (2006.01)
(52) U.S. Cl. ...................... 257/659; 257/778
(58) Field of Classification Search ................ 257/488, 257/737, 738, 727, 728, 690, 700, 659, 660, 257/711, 678, 777, 686, 691, 693, 698, 774, 257/778

See application file for complete search history.

(56) References Cited

U.S. PATENT DOCUMENTS

| | | | | |
|---|---|---|---|---|
| 4,106,049 A | * | 8/1978 | Shinozaki et al. | .......... 257/574 |
| 4,561,932 A | * | 12/1985 | Gris et al. | ................... 156/643 |
| 5,283,454 A | * | 2/1994 | Cambou | ..................... 257/328 |
| 5,866,943 A | * | 2/1999 | Mertol | ........................ 257/712 |
| 5,962,924 A | * | 10/1999 | Wyland et al. | ............. 257/778 |
| 6,092,281 A | | 7/2000 | Glenn | |
| 6,109,530 A | * | 8/2000 | Larson et al. | ............... 235/492 |
| 6,317,333 B1 | * | 11/2001 | Baba | ........................ 361/795 |

FOREIGN PATENT DOCUMENTS

JP 03093266 A * 9/1989

OTHER PUBLICATIONS

Search Report issued by the German Patent and Trademark Office on Jul. 4, 2001.

* cited by examiner

*Primary Examiner*—Hoai Pham
*Assistant Examiner*—Dana Farahani
(74) *Attorney, Agent, or Firm*—Laurence A. Greenberg; Werner H. Stemer; Ralph E. Locher

(57) ABSTRACT

An electronic component with shielding is described. The component has a semiconductor chip with a semiconductor substrate. Disposed in a region of a rear side of the semiconductor substrate is an electrically conductive buried layer. The buried layer is connected via a ground lead, disposed within the semiconductor substrate, to a contact area and an external ground potential. Furthermore, the invention relates to a method for producing an electronic component of this type.

12 Claims, 2 Drawing Sheets

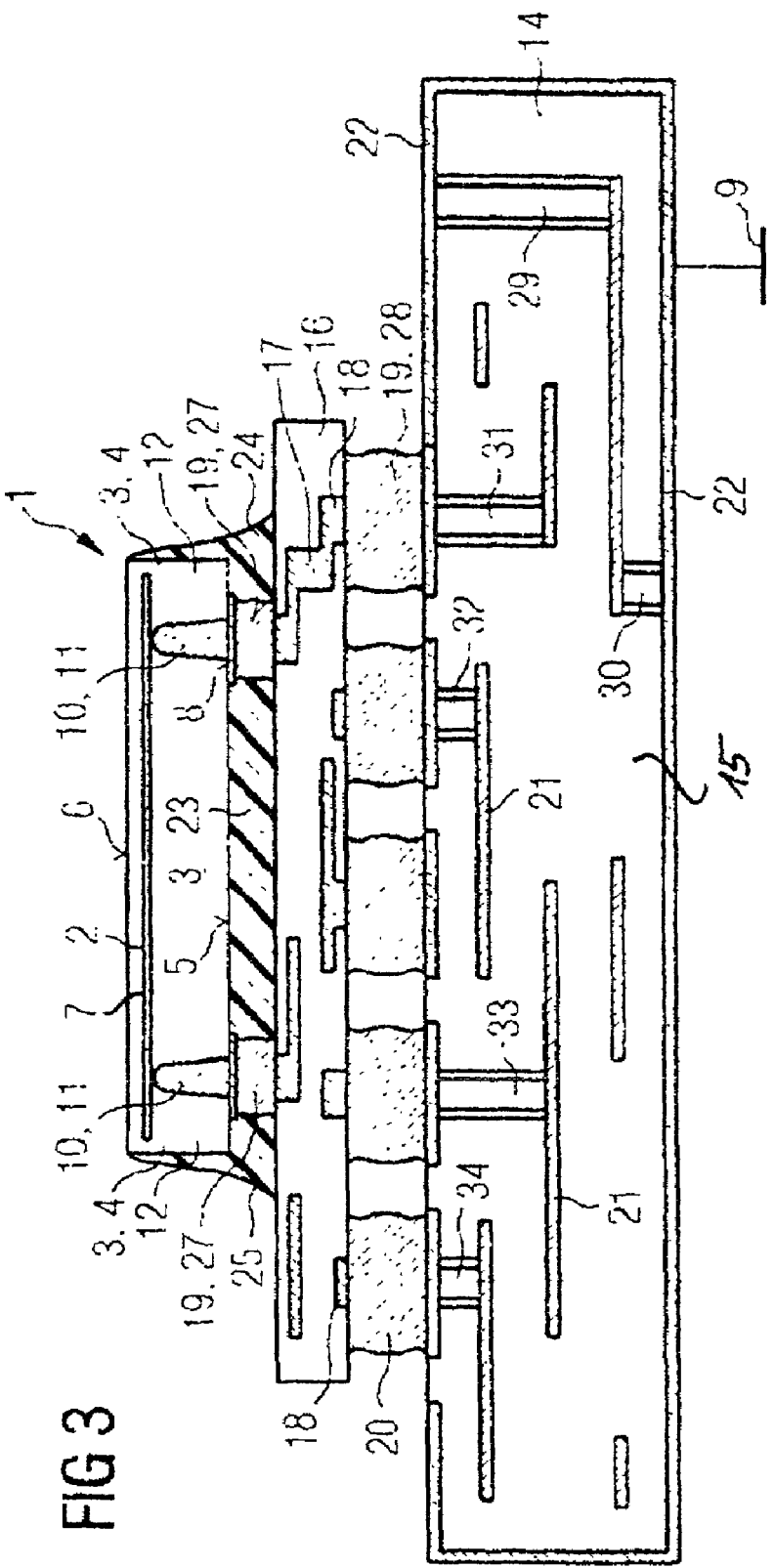

ELECTRONIC COMPONENT WITH SHIELDING AND METHOD FOR ITS PRODUCTION

BACKGROUND OF THE INVENTION

Field of the Invention

The invention relates to an electronic component with shielding and to a method for its production.

The sensitivity of integrated circuits on semiconductor chips to external electromagnetic influences increases with an increasing operating frequency. For radio-frequency components, semiconductor chips based on flip-chip technology are increasingly being disposed in an electronic component. In flip-chip technology, an active upper side of a chip is disposed opposite a ceramic substrate or a printed-circuit board. A passive rear side of the chip is consequently not protected by the ceramic substrate or the printed-circuit board and is exposed to the influence of electromagnetic fields. Consequently, interference signals, noise and the like can be coupled in via the rear side of the semiconductor chip, impairing the serviceability of the electronic component. Furthermore, to reduce the size of electronic components, there is now the practice of using the rear side of the semiconductor chips as part of the outer surface of the housing, with the result of increasing the risk of stray fields being coupled in.

SUMMARY OF THE INVENTION

It is accordingly an object of the invention to provide an electronic component with shielding and a method for its production which overcomes the above-mentioned disadvantages of the prior art devices and methods of this general type, in which the coupling in of stray electromagnetic fields is reduced and a low-cost method for its production is described.

With the foregoing and other objects in view there is provided, in accordance with the invention, an electronic component with shielding against stray electromagnetic fields. The electronic component contains a ground potential terminal for receiving an external ground potential, a semiconductor chip having a semiconductor substrate with an active upper side and a passive rear side having a surface area, at least one ground lead disposed within the semiconductor substrate, and a buried layer being electrically conductive and having a surface area corresponding in size to the surface area of the passive rear side. The buried layer is disposed within the semiconductor substrate in a region of the passive rear side and is connected to the ground potential terminal through the ground lead. At least one contact area is disposed on the upper side of the semiconductor substrate.

The electronic component according to the invention has the advantage that the active area of the chip is shielded by the electrically conductive buried layer on the rear side of the semiconductor substrate, connected to ground potential. The ground potential is applied to the buried layer for shielding via the ground lead disposed within the semiconductor substrate and a contact area on the upper side of the semiconductor substrate. Sensitivity to stray fields on the rear side of the semiconductor chip, which is sometimes used as an outer side of a housing, is reduced by the shielding.

The buried layer according to the invention performs a different task than buried layers within integrated circuits and semiconductor components. These serve on the one hand for reducing bulk resistances and on the other hand are intended to isolate a number of electronic components of an integrated circuit from one another. Effective shielding of the different semiconductor components on the active upper side of the semiconductor chip from stray electromagnetic fields is only achieved by the uninterrupted buried layer extending over the entire surface area of the electronic component or the semiconductor substrate.

Any coupling in of stray electromagnetic fields from the exposed rear side of the semiconductor chip of an electronic component is reduced. Acting together with the ground lead, disposed within the substrate and leading to the surface of the semiconductor substrate, the buried layer disposed within the semiconductor substrate forms a resistive connection to a contact surface on the upper side of the semiconductor chip, to which an external ground potential can be applied at any time.

In one embodiment of the invention, the buried layer is formed of a semiconductor material doped with an impurity concentration of over $1 \times 10^{20}$ cm$^{-3}$. The embodiment has the advantage that such a high impurity concentration brings about a virtually metallic conductivity in a semiconductor material. Consequently, with the buried layer, the semiconductor material itself can act like a shielding plate, which can be disposed on the rear side of the semiconductor substrate in order to shield against electromagnetic interference fields. Since, furthermore, the buried layer is disposed within the semiconductor substrate, no additional volume is taken up for the shielding, and consequently the component size of an electronic component to be shielded is minimized.

A further embodiment provides that the semiconductor material is identical to the material of the semiconductor substrate. The identity of the semiconductor material of the buried layer with the semiconductor material of the semiconductor substrate has the advantage that no lattice stresses occur in the semiconductor material and also that no thermal stresses on account of different coefficients of expansion put the electronic component at risk.

A further embodiment of the invention provides that the semiconductor substrate is formed of a monocrystalline silicon. Providing buried layers which are electrically conductive in a monocrystalline silicon is relatively uncritical, especially in microscopic dimensions, i.e. selectively buried layers can be realized in the monocrystalline silicon in dimensions in the range of several square micrometers to reduce bulk resistances of electronic components. Consequently, to realize the electronic component according to the invention, an analogous technology may be used, in order to realize in the monocrystalline silicon a buried layer of a surface area corresponding in size to the size of the surface area of the rear side of the electronic component.

A further embodiment of the invention provides that an electrically conductive annular layer, which extends from the upper side of the semiconductor substrate to the buried layer, is disposed in the edge region of the electronic component. An annular layer of this type forms a ground lead which is disposed within the semiconductor substrate, annularly surrounds the electronic component, in particular the integrated circuit of the electronic component, in the region of the upper side of the semiconductor substrate and consequently completes the rear-side shielding with an edge shielding. This also shields the edge areas from electromagnetic interference fields. Annular is understood in this connection not as meaning a circular shape but as meaning an uninterrupted ring which is disposed along the edge region of the electronic component and, on account of the rectangular shape of the semiconductor chip, consequently also proceeds in an angular form. Within the annular layer there is consequently complete shielding of the semiconductor material, both toward the rear side of the electronic component and toward its edge sides.

A further embodiment of the invention provides that the annular layer is formed of a semiconductor material doped with an impurity concentration of over $1\times10^{20}$ cm$^{-3}$. By analogy with the buried layer on the rear side of the electronic component, on account of the high impurity concentration of over $1\times10^{20}$ cm$^{-3}$, the annular layer acts like a metal ring which is placed around the electronic component for shielding. Since the metallically conductive annular layer is disposed within the semiconductor substrate, it is possible to dispense with a surrounding of the electronic component with a shielding plate, which minimizes the dimensions of the electronic component.

A preferred embodiment of the invention provides that the electronic component is a component of a flip-chip mounting technique. In the flip-chip mounting technique, solder balls or solder contact bumps are disposed on the upper side of the semiconductor chip, with the result that these components can be mounted with their upper side directly on a printed-circuit board or a ceramic substrate. Electronic components of this type no longer have any contact pins and can therefore be mounted extremely compactly by the flip-chip mounting technique, which for use in the case of radio-frequency components brings with it the advantage of short connecting lines. This reduces instances of both capacitive and inductive interference being coupled in. The shielding provided by the buried layer on the rear side of the electronic component allows a radio-frequency component configured in such a way to be additionally protected against any coupling in of stray electromagnetic fields.

A further embodiment of the invention provides that, for connection to an external ground potential, a solder ball or a solder contact bump is disposed on the contact area of the upper side of the semiconductor substrate. This embodiment has the advantage that no separate method step is required for the connection of the ground potential. Rather, in flip-chip technology in particular, the ground potential can be led through to the buried layer and the ground lead present within the semiconductor substrate with the connection of the other contact areas, which are likewise provided with solder balls or solder contact bumps.

A further embodiment of the invention provides that a wiring foil with connecting lines is disposed on the upper side of the electronic component. The connecting lines of the wiring foil are connected to the contact areas of the semiconductor chips, it being possible for the contact areas of the semiconductor chips to be kept microscopically small, i.e. they can take up a surface area of a few square micrometers in size, since no voluminous solder balls or solder contact bumps have to be provided. Instead, they are provided on corresponding output contact areas of the wiring foil and are distributed over the entire surface area of a semiconductor substrate. In this case, the output contact areas can carry larger solder balls and larger solder contact bumps than the contact areas of the semiconductor chip itself, since the entire surface of the semiconductor chip is available for disposing the external solder contact bumps or external solder balls.

In a further embodiment of the invention, it is therefore envisaged to apply the ground potential to the buried layer via at least one solder ball or one contact bump, via the wiring foil and via the annular layer. This has the advantage that the ground potential of relatively large conductor tracks of a ceramic substrate or of a printed-circuit board can be applied to the buried layer on the rear side of the semiconductor substrate via the likewise relatively large output contact areas of the wiring foil and via the microscopically small contact areas, and correspondingly microscopically small ground leads within the semiconductor substrate. Consequently, the connection of the electronic component according to the invention and the connection of the shielding of the electronic component according to the invention are relatively uncritical for the user and consumer, since macroscopic dimensions are available to him for fitting into his electronic circuit, on account of the use of the wiring foil. Macroscopic refers to in this connection perceptible with the naked eye, without the use of a stereo microscope or similar magnifying aids.

A method for producing an electronic component with shielding, the electronic component having the semiconductor chip containing the semiconductor substrate with the active upper side and the passive rear side, has at least the following method steps:

a) providing a semiconductor wafer for at least one integrated circuit of an electronic component on the active upper side;

b) implanting impurities to form a buried layer which is electrically conductive and the size of the surface area of which corresponds to the size of the surface area of the rear side, from the rear side of the semiconductor wafer;

c) introducing an electrically conductive annular layer from the upper side of the semiconductor wafer as far as the buried layer, the annular layer being disposed in the edge region of each electronic component;

d) separating the semiconductor wafer into individual semiconductor chips after the completion of method steps on the semiconductor wafer for the production of at least one integrated circuit within the annular layer; and e) packaging the semiconductor chip to form the electronic component with the shielding.

In the method, semiconductor wafers polished on both sides are preferably provided. Component structures and integrated circuits can be introduced on a front side of the semiconductor wafer. From the polished rear side, implantation over a large area of the entire semiconductor wafer with a high impurity concentration is made possible in order to introduce an uninterrupted buried layer. In this implantation of impurities, the concentration of the impurities is set to at least $1\times10^{20}$ cm$^{-3}$, in order to produce a virtually metallic conductivity within the semiconductor wafer from the rear side. The implantation step may also be performed as the last step relating to semiconductor technology, since for implantation it is only necessary to keep the rear side free from oxide layers and other layers hindering the implantation. Furthermore, the ion implantation is a targeted operation, which can be carried out either only from the rear side or only from the upper side. To this extent, an ion-implanted layer is advantageous, like the large-area uninterrupted electrically conductive buried layer according to the invention, for shielding from magnetic interference fields.

An annular ground lead which is to be disposed in the edge region of the semiconductor chip can be achieved by selective introduction, i.e. by use of a structured mask, with a high impurity concentration of at least $1\times10^{20}$ cm$^{-3}$ by diffusion processes from an unlimited impurity source. An unlimited impurity source would be, for example, a solid source such as boron nitride for boron as the impurity element and/or a liquid source such as phosphoryl chloride as the impurity source for phosphorus. The phosphoryl chloride is initially deposited as a phosphorus glass on a structured diffusion mask. Then a high concentration of phosphorus atoms is introduced from the phosphorus glass in the region of the annular layer. As soon as the buried layer in the region of the rear side of the semiconductor chip is reached by the annular highly doped layer, for example in a diffusion step, the ground potential can pass from the upper side of the semiconductor to the rear side of the semiconductor, or then of the semiconductor chip.

For this purpose, in a further step, the semiconductor wafer is separated into individual semiconductor chips and subsequently packaged to form electronic components with built-in shielding. A method of this type has the advantage that, in addition to the previously introduced buried layers for individual electronic components, a large-area shielding layer is now provided as a buried layer.

With an alternative method, a buried layer of this type can also be introduced from the upper side. In this alternative method, a large-area buried layer is likewise achieved on the semiconductor wafer, lying deep enough to allow components and integrated circuits still to be provided above the buried layer, which is intended to serve as the shielding. The alternative method has the following method steps:

a) providing a semiconductor wafer for at least one integrated circuit of an electronic component;
b) growing a sequence of layers formed of an electrically conductive semiconductor material and an electrically intrinsically conductive semiconductor material on the upper side of the semiconductor wafer by an epitaxial growth of the layers on a monocrystalline semiconductor wafer, an electrically conductive layer forming as the buried layer under the electrically intrinsically conductive layer;
c) after introducing the buried layer, an electrically conductive annular layer is introduced from the upper side of the semiconductor wafer, extending through the intrinsically conductive layer and reaching in depth as far as the buried layer, thereby disposing the annular layer in the edge region of the semiconductor chip;
d) separating the semiconductor wafer into individual semiconductor chips only takes place once method steps on the semiconductor wafer for producing integrated circuits within the annular layer have been completed; and
e) as the final step, the encapsulation or packaging of the semiconductor chip to form an electronic component with shielding then follows.

The intrinsically conductive layer epitaxially deposited after the highly doped electrically conductive buried layer should have as few foreign atoms as possible, or none at all, acting as impurities. However, such high degrees of purity, which allow intrinsic conduction of the semiconductor are virtually unachievable, with the result that a residual doping of up to $10^{15}$ foreign atoms per $cm^{-3}$ can be tolerated in the intrinsically conductive semiconductor. The rise in the purity of the semiconductor material from the transition from the electrically conductive buried layer to the virtually intrinsically conductive semiconductor layer consequently contains at least 5 orders of magnitude. Since this example of how the method is carried out also provides an electrically conductive buried layer as shielding on the rear side of the semiconductor chip, it is simply a matter of which of the two methods is less expensive. One of the deciding factors here is when the step for producing the buried electrically conductive layer is to be carried out.

In the case of the first example of how the method is carried out, the implantation step can be carried out right at the end of processing the semiconductor wafer, whereas the alternative method, by growing on epitaxial layers, has to be right at the beginning of the production of the semiconductor wafer with the integrated circuits for the electronic components. While the ion-implantation method involves low thermal energy, the epitaxial method can only be carried out when the silicon is red hot. However, the expenditure on the apparatus for the epitaxial depositing is significantly lower than for an ion implantation. Therefore, an ion-implantation system represents a much greater investment than an epitaxy system. It is possible for both methods to be used to realize the present invention.

In an example of how the method is carried out, solder balls or solder contact bumps are disposed on and soldered onto contact areas of the upper side of the semiconductor wafer. The dimensions of a solder ball and/or of a solder contact bump must be kept small and have a diameter in the range of 20–300 µm, preferably 50 to 150 µm. Larger solder balls or solder contact bumps would take up too large an area on the semiconductor to allow electronic components to be produced from it economically. The advantage of the method step is, however, that the solder balls and solder contact bumps can be applied simultaneously to an entire semiconductor wafer for several chips, or even many chips, before it is separated into individual semiconductor chips.

A further example of how the method is carried out provides that, when connecting the solder balls or solder contact bumps to a printed-circuit board or a ceramic substrate, at least one solder ball or one solder contact bump is at the same time connected to a ground potential. This variant of the method has the advantage that no extra connection step has to be performed by leading the ground up to the ground lead located within the semiconductor substrate and the buried layer located within the semiconductor substrate, but instead the connection step can be carried out with all the solder balls or solder contact bumps at the same time.

An alternative example of how the method is carried out provides that initially the contact areas of the semiconductor chip are connected to connecting lines of a wiring foil. The connecting lines of the wiring foil can be adapted in their dimensions to extremely small dimensions, lying in the micrometer range, of semiconductor contact areas. This has the advantage that only the smallest possible semiconductor chip area is lost for the contact-making. The connecting lines on the wiring foil lead to macroscopic output contact areas, to which correspondingly larger, that is macroscopic, solder balls or solder contact bumps can be applied. This is because, on account of the use of the wiring foil, the entire surface area of the semiconductor chip is available for the configuration of the solder contact bumps or solder balls. In this connection, macroscopic refers to "dimensions and structures which can be perceived with the naked eye, without the aid of microscopes". After providing the wiring foil on each semiconductor chip, or alternatively on the entire semiconductor wafer, and after the individual separation, the solder balls or solder contact bumps of the wiring foil are connected to lines of a printed-circuit board or of a ceramic substrate. At least one of the solder balls or solder contact bumps is in this case connected to a ground-carrying line of the printed-circuit board or of the ceramic substrate. It is consequently again ensured that the shielding within the semiconductor substrate can be connected to the external ground potential via the ground lead provided in the semiconductor substrate and via the buried layer, especially since a shielding effect can only be achieved by the grounding.

In a further example of how the method is carried out, an annular contact area, which establishes electrical contact for the annular conductive layer, is disposed in the edge region of the upper side of the semiconductor chip. An annular contact area of this type has the associated advantage that correspondingly annular solder beads can be disposed on the semiconductor chip, and consequently a shielding ring is realized around each semiconductor chip or each electronic component. Instead of an uninterrupted shielding ring of solder material, similarly annularly disposed solder balls or solder contact bumps can also be disposed in the edge region of the semiconductor chip and be electrically connected to the ground potential of a printed-circuit board or of a ceramic substrate.

With the electronic component according to the invention and the two possible methods for producing a component of this type, the sensitivity of integrated circuits on semiconductors to external electromagnetic influences with increasing operating frequency is minimized. Consequently, the influencing of the electrical functions and of the electrical properties of the integrated circuit on the semiconductor is avoided to the greatest extent and a protection, which can be connected to ground potential is achieved over the surface area of the rear side. Consequently, the electronic component can be used for the flip-chip mounting technique, the active side being mounted downward, that is toward the printed-circuit board. The flip-chip connecting technique is recommendable in particular for radio-frequency integrated circuits because of the short electrical connection length and, as a result of the shielding according to the invention, is consequently insensitive to stray electromagnetic fields.

For this purpose, for radio-frequency applications, a conductive base layer close to the rear side of the integrated circuit, generally referred to as the buried layer, must be realized during the production of the integrated circuit. Ground connections to the conductive base layer within the semiconductor substrate can be provided by special grounding contact areas on the upper side of the integrated circuits. The conductive ground-connecting layers and the conductive buried layer allow the shielding of the active structures on the upper side of the semiconductor substrate to be achieved. To achieve further improved shielding, a peripheral annular through-plating can be carried out instead of individual through-platings to the base layer or buried layer.

With the invention it is therefore possible to use the flip-chip mounting technique also in the case of integrated circuits for radio frequency and to use the flip-chip-specific advantages of the shorter transmission lengths, without at the same time having to forgo rear-side shielding. In addition, there is no longer any need in the mounting process for the process steps otherwise required for shielding, since this ground contacting can be carried out for the component according to the invention at the same time as the contacting of the signal lines.

This altogether produces the advantages of integrating and using the conductive layers in radio-frequency integrated circuits for shielding reasons and combining the above steps with the flip-chip mounting technique by providing individual solder contact bumps or a peripheral ring of solder contact bumps.

Other features which are considered as characteristic for the invention are set forth in the appended claims.

Although the invention is illustrated and described herein as embodied in an electronic component with shielding and a method for its production, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a cross-sectional view of the electronic component with shielding according to a third embodiment of the invention.

DESCRIPTION OF THE PREFERRED EMBODIMENTS

Figure 1:
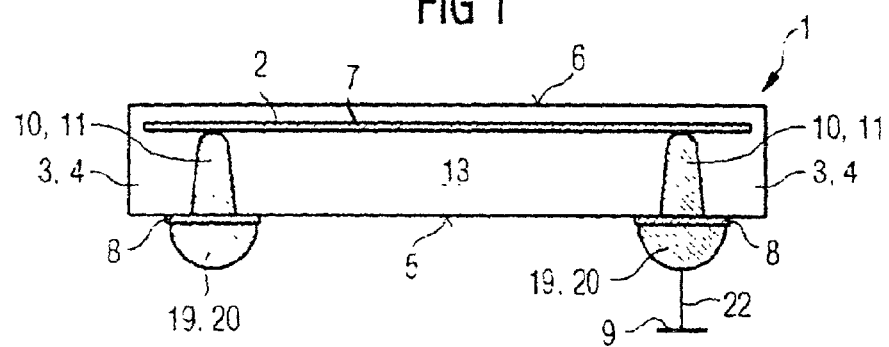
FIG. 1 is a diagrammatic, cross-sectional view of an electronic component with shielding according to a first embodiment of the invention.

Referring now to the figures of the drawing in detail and first, particularly, to FIG. 1 thereof, there is shown a schematic cross section view of an electronic component 1 with shielding 2 according to a first embodiment of the invention. In FIG. 1, the reference number 3 designates a semiconductor chip. The reference number 4 designates a semiconductor substrate with an active upper side 5 and a passive rear side 6. The substrate 4 is part of a wafer 13. The reference number 7 designates an electrically conductive buried layer in a region of the rear side 6 of the semiconductor substrate 4 and the reference number 8 designates a contact area on the active upper side 5 of the semiconductor chip 4, which is provided for a connection to an external ground potential terminal 9. The reference number 10 designates a ground lead within the semiconductor substrate 4 and the reference number 11 designates an electrically conductive annular layer within the semiconductor substrate 4, which may serve as the ground lead 10 for the connection between the contact area 8 and the buried layer 7.

The electronic component 1 with the shielding 2 of FIG. 1 has the semiconductor chip 3 with the active upper side 5 and the passive rear side 6. In the region of the passive rear side 6 there is within the semiconductor substrate 4 an electrically conductive buried layer with an impurity concentration of at least $1\times10^{20}$ cm$^{-3}$, which on account of the high impurity concentration has virtually metallically conductive properties. The upper side 5 has at least one contact area 8, which is connected to the ground potential terminal 9. The electrically conductive buried layer 7 is connected to the contact area 8 on the upper side 5 via the electrically conductive ground connection 10 within the semiconductor substrate 4. The ground connection 10 is a region which reaches from the contact area 8 to the buried layer 7 and has an impurity concentration of at least $1\times10^{20}$ cm$^{-3}$, and is consequently virtually metallically conductive. Via the ground connection 10 within the semiconductor substrate 4, the external ground potential 9 is connected to the buried layer 7.

With the rear-side shielding by the buried layer 7, it is possible to protect the active upper side 5 with its active integrated circuit from electromagnetic interference fields. All that is required for this purpose is at least one ground lead within the semiconductor substrate 4. A ground lead of this type can be achieved by deep diffusion of impurities, for example into a silicon substrate.

In the exemplary embodiment according to FIG. 1, the buried layer 7, highly doped with an impurity concentration of at least $1\times10^{20}$ cm$^{-3}$, was achieved by ion implantation from the rear side. For this purpose, the semiconductor wafer 13, which in this exemplary embodiment is formed of a monocrystalline silicon slice, was polished on both sides, with the result that a polished surface was prepared as the rear side 6 for ion implantation and the other polished surface was provided as the upper side 5 for corresponding structuring with the electronic components. According to the embodiment as shown in FIG. 1, the electronic component 1 is structured in such a way that, with its buried layer 7 as shielding and the ground connection 10 to the upper side, it is configured for a flip-chip mounting technique. For this purpose, it has on the contact areas 8 of the upper side 5 solder contact bumps 20, which are suitable for placing directly onto a printed-circuit board 14 or a ceramic substrate 15. Consequently, the entire rear side of the semiconductor chip 3 forms an effective shielding for protection of the upper side 5 of the semiconductor chip 3 fitted with active components.

Figure 2:
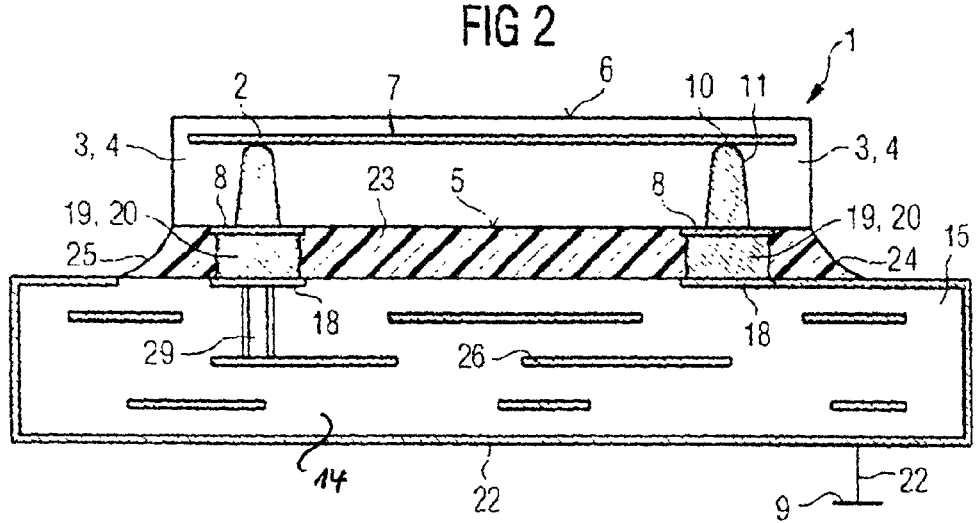
FIG. 2 is a cross-sectional view of the electronic component with shielding according to a second embodiment of the invention.

FIG. 2 shows a schematic cross section of the electronic component 1 with the shielding 2 according to a second embodiment of the invention. Components of FIG. 2, which perform the same functions as in FIG. 1 are identified by the same reference numerals.

In the case of the embodiment according to FIG. 3, the semiconductor chip, which can be seen in FIG. 1 has been soldered with its solder contact bumps on output contact areas 18 of a multi-layer printed-circuit board. The buried layer 7 was produced for this embodiment of the invention by epitaxial growth of an epitaxial layer, highly doped with at least an impurity concentration of $1\times10^{20}$ cm$^{-3}$, on a base substrate with a subsequent epitaxial layer which has only intrinsic conductivity. In the example of FIG. 2, the base substrate was ground down until thin, with the result that only a slight residue on the rear side above the buried layer remains visible in cross section.

Introduced from the active upper side 5 into the regions of the intrinsically conductive monocrystalline silicon lying above the buried layer is the integrated circuit, which is surrounded by a ring of highly doped silicon material. The annular layer 11 has an impurity concentration of at least $1\times10^{20}$ cm$^{-3}$, and consequently has virtually metallic conductivity. In the case of the embodiment of FIG. 2, the semiconductor chip 3 which can be seen in FIG. 1 has been soldered with its solder contact bumps onto the output contact areas 18 of a multi-layer printed-circuit board.

An intermediate space between the active upper side 5 of the semiconductor chip 3 is filled by a plastic molding compound 23. Side edges 24 and 25 of the plastic molding compound can, if need be, cover the entire semiconductor chip 3 and its side edges and, if required, can also be spread over the rear side 6 with the buried layer 7. This depends on the area of application of the electronic component shown in FIG. 2.

In FIG. 2, the multi-layer printed-circuit board 14 is surrounded by a ground-carrying line 22 and connected to ground potential 9, with the result that the conductor track layers 26 are also completely shielded. A radio-frequency component of this type is consequently protected against electromagnetic interference fields and can be used in many areas, such as preferably as an output stage in mobile radio telephones.

FIG. 3 shows a schematic cross section of the electronic component 1 with the shielding 2 according to a third embodiment of the invention. In FIG. 3, components that perform the same function as in the embodiments of FIG. 1 and FIG. 2 are designated by the same reference numerals and an explanation is therefore omitted.

In the embodiment of the invention as shown in FIG. 3, the peripheral annular ground lead 10 has been introduced into the silicon substrate 4 and connected to a peripheral annular solder contact bump. On account of its high impurity concentration, the ground lead 10 is a layer, which has virtually metallic conductivity. Consequently, the active region of the semiconductor chip within the annular highly doped layer is shielded against interference fields.

The embodiment of the invention according to FIG. 3 has the advantage that an annular layer at ground potential surrounds the active upper side 5 of the semiconductor chip 3 and at the same time establishes electrical contact for the buried layer 7 in the region of the rear side 6 of the semiconductor chip. The annular solder contact bump is connected via a connecting line 17 in a wiring foil 16 to an external contact bump 28, which for its part is connected via the ground-carrying line 22 to the ground potential terminal 9.

Consequently, the embodiment, which shows the semiconductor chip 3 on the wiring foil 16 and the printed-circuit board 14, on which the electronic component 1 is mounted, is also shielded against stray electromagnetic radiation or interference radiation.

While the wiring foil 16 is essentially composed of a polyimide, which has a number of conductor track layers of metal, the printed-circuit board 14 is composed of conductor tracks 21 and 22 and also contact vias 29 to 34. In the case of the embodiment, the wiring foil 16 has the task of increasing the size of the microscopically small, i.e. measurable only with an optical microscope, contact areas 8 of the semiconductor chip 3 to the macroscopic output contact areas 18, which can be perceived and measured with the naked eye, with the result that the macroscopic output contact areas 18 can carry correspondingly visible and adjustable solder contact bumps 20 and the external contact bumps 28 and are matched in their extent to the structures and dimensions of the structures on the printed-circuit board 14.

We claim:

1. An electronic component with shielding against stray electromagnetic fields, the electronic component comprising:
   a ground potential terminal for receiving an external ground potential;
   a semiconductor chip having a semiconductor substrate with an active upper side and a passive rear side having a surface area;
   at least one ground lead disposed within said semiconductor substrate and having at least one contact area contacting said upper side of said semiconductor substrate for connecting to said ground potential terminal; and
   a continuous electrically conductive buried layer having a surface area corresponding in size to said surface area of said passive rear side and entirely extending over said surface area, said buried layer disposed within said semiconductor substrate adjacent said passive rear side and connected to said ground potential terminal through said ground lead for providing a rear side shielding with said buried layer, and said buried layer being formed of a semiconductor material doped with an impurity concentration of over $1\times10^{20}$ cm$^{-3}$.

2. The electronic component according to claim 1, wherein said semiconductor material is identical to a material forming said semiconductor substrate.

3. The electronic component according to claim 1, wherein said semiconductor substrate is formed of monocrystalline silicon.

4. The electronic component according to claim 1, including an electrically conductive annular layer extending from said upper side of said semiconductor substrate to said buried layer, and disposed in an edge region of said semiconductor chip.

5. The electronic component according to claim 4, wherein said electrically conductive annular layer is formed of a semiconductor material doped with an impurity concentration of over $1 \times 10^{20}$ cm$^{-3}$.

6. The electronic component according to claim 4, including:
   output contact areas;
   a wiring foil with connecting lines disposed on said upper side of said semiconductor substrate, said contact area of said semiconductor chip is one of a plurality of contact areas and said connecting lines of said wiring foil connecting said contact area of said semiconductor chip to said output contact areas distributed on said wiring foil; and
   solder formation selected from the group consisting of solder balls and solder contact bumps disposed on said output contact areas.

7. The electronic component according to claim 6, wherein said ground potential terminal is connected through at least one of said solder formations, through said wiring foil and through said annular layer to said buried layer.

8. The electronic component according to claim 1, wherein the electronic component is a component of a flip-chip mounting technique.

9. The electronic component according to claim 1, wherein the electronic component is a radio-frequency component.

10. The electronic component according to claim 1, including solder formations selected from the group consisting of solder balls and solder contact bumps disposed on said contact area, and a shielding ground-carrying line connected to said solder formations.

11. The electronic component according to claim 2, including a mounting device selected from the group consisting of a printed circuit board and a ceramic substrate, and said solder formations mounted to said mounting device.

12. The electronic component according to claim 1, including a shielding ground-carrying line connected to said at least one contact area.

* * * * *

UNITED STATES PATENT AND TRADEMARK OFFICE
CERTIFICATE OF CORRECTION

PATENT NO. : 7,045,881 B2
APPLICATION NO. : 09/993266
DATED : May 16, 2006
INVENTOR(S) : Robert-Christian Hagen et al.

It is certified that error appears in the above-identified patent and that said Letters Patent is hereby corrected as shown below:

Column 12, lines 17-20, claim 11, should read as follows:

11. The electronic component according to claim 10, including a mounting device selected from the group consisting of a printed circuit board and a ceramic substrate, and said solder formations mounted to said mounting device.

Signed and Sealed this

Twelfth Day of December, 2006

JON W. DUDAS
*Director of the United States Patent and Trademark Office*